United States Patent
Zaidi et al.

(10) Patent No.: US 6,858,462 B2
(45) Date of Patent: Feb. 22, 2005

(54) ENHANCED LIGHT ABSORPTION OF SOLAR CELLS AND PHOTODETECTORS BY DIFFRACTION

(75) Inventors: Saleem H. Zaidi, Albuquerque, NM (US); James M. Gee, Albuquerque, NM (US)

(73) Assignees: Gratings, Inc., Albuquerque, NM (US); Sandia Corporation, Albuquerque, NM (US)

(*) Notice: Subject to any disclaimer, the term of this patent is extended or adjusted under 35 U.S.C. 154(b) by 0 days.

(21) Appl. No.: 09/834,308

(22) Filed: Apr. 11, 2001

(65) Prior Publication Data

US 2002/0000244 A1 Jan. 3, 2002

Related U.S. Application Data

(60) Provisional application No. 60/195,836, filed on Apr. 11, 2000.

(51) Int. Cl.⁷ ..................... H01L 21/02; H01L 31/0232
(52) U.S. Cl. .................... 438/71; 136/252; 136/259; 136/261; 438/47; 438/72; 257/184; 257/436; 257/466
(58) Field of Search ................. 136/252, 255, 136/256, 257, 261; 438/71, 72, 57, 65; 257/436, 184, 460; 216/58, 83

(56) References Cited

U.S. PATENT DOCUMENTS

| | | | | |
|---|---|---|---|---|
| 4,315,097 A | * | 2/1982 | Solomon | 136/255 |
| 4,419,533 A | * | 12/1983 | Czubatyj et al. | 136/259 |
| 5,035,770 A | * | 7/1991 | Braun | 438/71 |
| 5,492,859 A | * | 2/1996 | Sakaguchi et al. | 438/459 |
| 5,792,280 A | * | 8/1998 | Ruby et al. | 136/258 |
| 6,091,021 A | * | 7/2000 | Ruby et al. | 136/261 |

OTHER PUBLICATIONS

Zaidi et al. "Si texturing with sub–wavelength structures" 26$^{th}$ PVSC (1997) pp. 171–174.*

Bean, K., "Anisotropic Etching of silicon," *IEEE*, vol. ED–25, No. 10, Oct., 1978, pp. 1185–1192.

Malag, A., "Simple interference method of diffraction grating generation for integrated optics by the use of fresnel mirror," *Optics Communications*, vol. 32, No. 1, Jan. 1980, pp. 54–58.

Douglas, E., "A study of the factors which control the efficiency of Ion–implanted silicon solar cells," *IEEE*, vol. ED–27, No. 4, Apr. 19, 1980, pp. 792–801.

(List continued on next page.)

*Primary Examiner*—Nam Nguyen
*Assistant Examiner*—Brian L. Mutschler
(74) *Attorney, Agent, or Firm*—Samuel M. Freund; Cochran Freund & Young LLC

(57) ABSTRACT

Enhanced light absorption of solar cells and photodetectors by diffraction is described. Triangular, rectangular, and blazed subwavelength periodic structures are shown to improve performance of solar cells. Surface reflection can be tailored for either broadband, or narrow-band spectral absorption. Enhanced absorption is achieved by efficient optical coupling into obliquely propagating transmitted diffraction orders. Subwavelength one-dimensional structures are designed for polarization-dependent, wavelength-selective absorption in solar cells and photodetectors, while two-dimensional structures are designed for polarization-independent, wavelength-selective absorption therein. Suitable one and two-dimensional subwavelength periodic structures can also be designed for broadband spectral absorption in solar cells and photodetectors. If reactive ion etching (RIE) processes are used to form the grating, RIE-induced surface damage in subwavelength structures can be repaired by forming junctions using ion implantation methods. RIE-induced surface damage can also be removed by post RIE wet-chemical etching treatments.

23 Claims, 21 Drawing Sheets

OTHER PUBLICATIONS

Pang, S.W., Rathman, D.D., Silversmith, D.J., Mountain, R.W., DeGraff, P.D., "Damage induced in Si by ion milling of reactive ion etching," *Journal of Applied Physics*, vol. 54 No. 6, Jun. 1983, pp. 3272–3277.

Sheng, P., Bloch, A.N., Stepleman, R.S., "Wavelength–selective absorption enchancement in thin–film solar cells," *Applied Physics Letter*, vol. 43, No. 6, Sep. 15, 1983, pp. 579–581.

Gaylord, T., Baird, W.E., Moharam, M.G., "Zero–reflectivity high spatial–frequency rectangular–groove dielectric surface–relief grating," *Applied Optics*, vol. 25, No. 24, Dec. 15, 1986, pp. 4562–4567.

Campbell, P., Green, M. A., "Light trapping properties of pyramidically textured surfaces," *Journal of Applied Physics*, vol. 62, No. 1, Jul. 1, 1987, pp. 243–249.

Zaidi, S. H., Brueck, S.R., "High aspect–ratio holographic photoresist gratings," *Applied Optics*, vol. 27, No. 14, Jul. 15, 1988, pp. 2999–3002.

Mishima, H., Yasui, T., Mizuniwa, T., Abe, M., Ohmi, T., "Particle free–wafer cleaning and drying technology," *IEEE*, vol. 2, No. 3, Aug. 1989, pp. 69–75.

Kopalidis, P.M., Jorne, J., "Langmuir probe measurements and characterization of silicon etching in SF6/O2 discharges," *Journal of Electrochemical Society*, vol. 139, No. 3, Mar. 1992, pp. 839–843.

Raguin, D.H., Morris, G.M., "Antireflection structured surfaces for the infrared spectral region," *Applied Optics*, vol. 32, No. 7, Mar. 1, 1993, pp. 1154–1167.

Heine, C., Morf, R.H., "Submicrometer gratings for solar energy applications," *Applied Optics*, vol. 34, No. 14, May 10, 1995, pp. 2476–2482.

Zaidi, X., Chu, An–Shyand., Brueck, S.K., "Optical properties of Nanoscal, one–dimensional silicon grating structures," *Journal of Applied Physics*, vol. 80, No. 12, Dec. 15, 1996, pp. 6997–7008.

Shirasawa, K., Fukui, K., Okada, K., Inomata, Y., Takahasi, H., Fukawa, Y., Fujiii., S., "Over 17% large area multicrystalline silicon solar cells," 14th *European Photoyoltaic Solar Energy Conference* Jun. 30 0 Jul. 4, 1997, Barcelona, Spain, pp. 384–387.

Ruby, D.S., Zaidi, S.H., Narayanan, S., "Plasma–texturization for multichrystalline silicon solar cells," Sandia National Laboratories, Albuquerque, NM, Gratings Inc., Albuquerque, NM, BP Solar, Frederick, MD 1998, pp. 75–78.

Lalanne, P., Astilean, S., Chavel, P., "Blazed binary sub-wavelength gratings with efficiencies larger than those of conventional echelette gratings," *Optical Society of America*, 1998, pp. 1081–1083.

Astilean, S., Lalanne, P., Chavel, P., "High efficiency sub-wavelength diffractive element patterned in a high–refractive–index material for 633 nm," *Optical Society of America*, 1998, pp. 552–554.

Goeckner, M.J. Felch, S.B., Fang, Z., Lenoble, D., Galvier, J., Grouillet, A., Yeap, G., C., Bang D., Lin, M., "Plasma doping for shallow junctions," *Journal of American Vacuum Science and Technology*, vol. B 17, No. 5, Sep./Oct. 1999, pp. 2290–2293.

Mizuno, S., Kazushi, Y., Tayanaka, H., Matsushita T., "High efficiency solar cells enhanced with diffraction grating," *Technical Digest of the International PVSEC–11* Sapporo, Hokkaido, Japan, 1999, pp. 341–342.

Zaidi, S. H., Gee, J.M., Ruby, D.S, "Diffraction grating structures in solar cells," *IEEE*, 2000, pp. 395–398.

Kemme, S.A., Saidi, S.H., Gee, J.M., "Submicron diffractive gratings for thin film solar cell applications," *Sandia National Laboratories, Phototonics Research*, presented at the 9th NREL Workshop on Crystalline–Silicon Photovoltaics, Breckenridge, CO.

* cited by examiner

ENHANCED LIGHT ABSORPTION OF SOLAR CELLS AND PHOTODETECTORS BY DIFFRACTION

RELATED CASES

The present patent application claims the benefit of Provisional Patent Application Serial No. 60/195,836 filed on Apr. 11, 2000 for "Method Using Diffraction For Increasing Light Absorption By Silicon".

STATEMENT REGARDING FEDERAL RIGHTS

The United States Government has rights in this invention pursuant to Department of Energy Contract No. DE-AC04-94AL85000 with Sandia Corporation.

FIELD OF THE INVENTION

The present invention relates generally to solar cells and photodetectors and, more particularly, to selective enhancement of absorption in either a narrowband or wideband spectral range of interest by efficient optical coupling of incident light into obliquely propagating orders inside the material of construction of the solar cell or photodetector.

BACKGROUND OF THE INVENTION

Solar cells and photodetectors have not benefited from recent advances in diffractive optics. Random, wet-chemical texturing techniques to form pyramids in the (100) Silicon (Si) crystal orientation have been extensively applied for both reducing reflection and enhancing absorption by increased oblique coupling into the solar cells (See, e.g., P. Campbell and M. A. Green, Appl. Phys. Lett. 62, 243 (1987)). Applicability of these texturing processes to thin-films ($\leq$20 $\mu$m), and low-cost, multi-crystalline (mc) Si are limited due to their large dimensions and preferential (100) crystal etching mechanisms. In recent years, random reactive ion etching (RIE) techniques have been developed for both thin films and mc-Si (See, e.g., Y. Inomata, K. Fukui, K. Shirasawa, 9$^{th}$ Internat. PVSEC, 109 (1996), D. S. Ruby, Saleem H. Zaidi and M. Naraynan, in 28$^{th}$ IEEE PVSC Conference held in Alaska in October 2000). Both of these techniques, when combined with suitable anti-reflection films, not only reduce absolute hemispherical reflection to ~5%, but also enhance near-IR (850–1200 nm) absorption by increased oblique coupling into the surface. By contrast with random wet or dry etching techniques, periodic structures offer highly controllable mechanisms for Si reflection and absorption response over a wide spectral range. T. K. Gaylord, W. E. Baird, and M. G. Moharam in Appl. Opt. 25, 4562 (1986) have described rigorous models for rectangular-profiled grating structures exhibiting zero reflection for a suitable choice of grating parameters. D. H. Raguin and G. M. Morris in Appl. Opt. 32, 1154 (1993) have determined broadband anti-reflection properties of 1D triangular and 2D pyramidal surfaces. Ping Shen, A. N. Bloch, and R. S. Stepleman in Appl. Phys. Lett. 43, 579 (1983) have reported wavelength-selective absorption enhancement of thin-film (~2 $\mu$m) amorphous Si solar cells by grating coupling into waveguide modes. In "Submicrometer Gratings For Solar Energy Applications" by Claus Heine and Rudolf H. Morf, Appl. Opt. 34, 2476 (1995) enhanced near-IR absorption in ~20 $\mu$m thick Si films by diffractive coupling has been demonstrated. Broadband and narrowband spectral reflection response of subwavelength Si grating structures has been reported by Saleem H. Zaidi, An-Shyang Chu, and S. R. J. Brueck in J. Appl. Phys. 80, 6997 (1996). Enhanced near-IR response of subwavelength grating solar cells has recently been demonstrated by Saleem H. Zaidi, J. M. Gee, and D. S. Ruby in 28$^{th}$ IEEE PVSC Conference held in Alaska in October, 2000.

Gaylord et al., supra, describes the anti-reflection properties of 1D rectangular grating structures; however, the need to create absorption close to the solar cell junction, particularly in the near-IR spectral range is not discussed. Heine and Morf, supra, presents a diffractive approach aimed at improving solar cell response at $\lambda$~1.0 $\mu$m. In a thin-film solar cell, near-IR absorption is weak due to the indirect bandgap of Si. By fabricating a grating structure at the back surface of the cell, enhanced absorption can be achieved by efficient coupling of the incident beam into two diffraction orders for a symmetric profile, or a single diffraction order for a blazed profile. Heine and Morf teaches away from the use of a front surface grating because of surface passivation issues. That is, Heine and Morf teaches that light-trapping that does not increase the surface area at which increased recombination losses would outweigh the benefits of increased light absorption is accomplished by effective separation of the electronic device structure in which electron-hole pairs are generated and collected from the optical structures used for enhancing the absorbed light within the electronically active region in the Si. By proper design of grating parameters, Heine and Morf teaches the choice of direction of propagation of diffraction orders such that at angles larger than the critical angle, these are trapped due to total internal reflection.

In "High Efficiency Solar Cells Enhanced With Diffraction Grating" by Sin-ichi Mizuno et al., Technical Digest of the International PVSEC-11, Sapporo, Hokkaido, Japan, 341 (1999), diffraction gratings are secured onto the front and back surfaces of thin film, single crystal silicon using an adhesive material having a refractive index of 2, such that the average light path on the surface of thin film silicon was tripled when compared with silicon thin films having a mirror placed on the back surface thereof.

Accordingly, it is an object of the present invention to improve light absorption in general, and IR absorption in particular of silicon solar cells and photodetectors by utilizing a front-surface grating structure to couple light into obliquely propagating diffraction orders inside silicon.

Another object of the present invention is to improve light absorption of solar cells and photodetectors without affecting the surface passivation of such devices.

Additional objects, advantages and novel features of the invention will be set forth, in part, in the description that follows, and, in part, will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects of the present invention, and in accordance with its purposes, as embodied and broadly described herein, the method for increasing the absorption of light radiation in solar cells and photodetectors hereof includes forming a grating on the front surface of the solar cell or photodetector such that higher diffraction orders are generated within the solar cell and photodetector when light is incident thereon, whereby the majority of the light energy entering the solar cell or photodetector is distributed into higher diffraction orders and absorption thereof is increased due to an increase in optical path lengths.

Benefits and advantages of the present method include improved performance of thin-film solar cells, space solar cells, and wavelength-selective photodetectors, where enhanced IR response is required as a result of either insufficient film thickness for light absorption or radiation-induced bulk damage leading to a material having a low lifetime.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION

Figure 1:
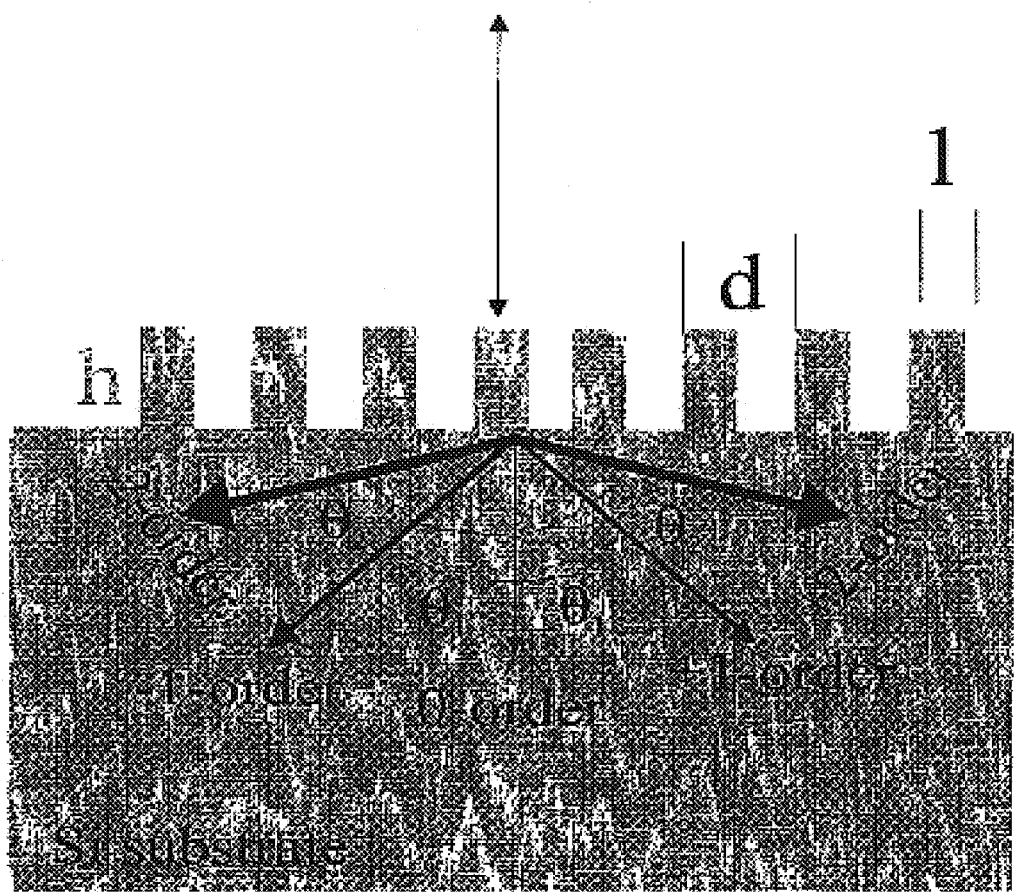
FIG. 1 illustrates oblique optical coupling into semiconductor using diffractive optics in accordance with the teachings of the present invention.

Briefly, the present invention includes a method for enhancing light absorption in selective spectral ranges by efficient optical coupling of light into obliquely propagating diffraction orders inside a silicon (Si) substrate. FIG. 1 hereof illustrates a grating etched on the front surface of a substrate which is characterized by its period d, linewidth l, and depth h. The light is normally incident and the period is chosen such that no diffraction orders in air are present. Due to symmetric profile, equal energy is coupled into the two ±1-diffraction orders and the two ±2-diffraction orders; the fraction of energy coupled into the first and second orders is a complex function of grating parameters. For improved solar cells, particularly in the space environment, it is desirable that the maximum energy be coupled into those orders propagating nearly parallel to the surface of light incidence; in the present situation, the maximum energy into the two ±2-diffraction orders, and the least energy into the normally propagating zero-order. Additionally, the ±1-diffraction and ±2-diffraction orders are seen to form angles $\theta_1$ and $\theta_2$ respectively, with respect to the surface normal, and that the optical path lengths for these orders are increased by $1/\cos \theta_1$ and $1/\cos \theta_2$ with respect to the zero-order transmitted beam. Thus, for angles, $\theta$, between 30° and 85°, this represents increase in optical path length relative to the zero-order of between approximately 1.15 and 11.5, respectively.

Reference will now be made in detail to the present preferred embodiments of the invention examples of which are illustrated in the accompanying drawings.

1. Fabrication of Subwavelength Periodic Structures in Silicon

Figure 2:
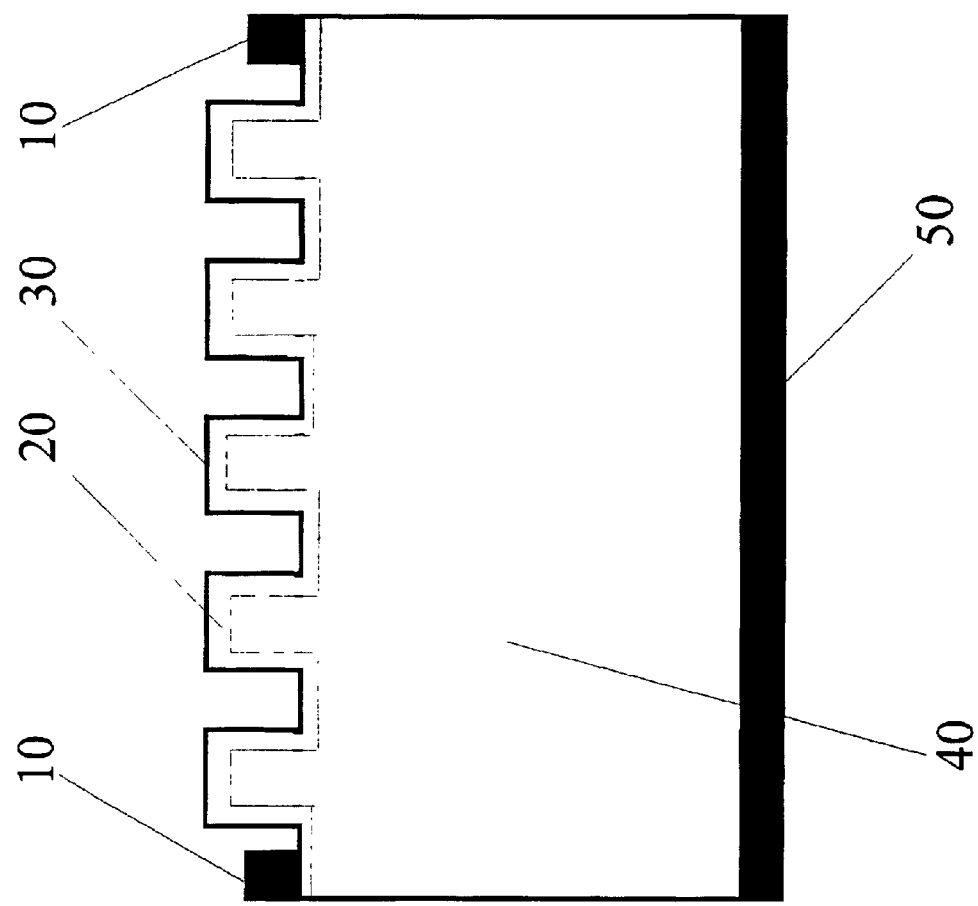
FIG. 2 is a schematic representation of a diffraction grating, solar cell structure in accordance with the teachings of the present invention.

Subwavelength periodic grating structures can be most conveniently fabricated using laser interference techniques (See, e.g., A. Malag, Opt. Commun. 32, 54 (1980), and Saleem H. Zaidi and S. R. J. Brueck, Appl. Opt. 27 (1988) describe typical fabrication techniques for these types of one- and two-dimensional structures. Interference between two coherent laser beams produces a simple periodic pattern at d=$\lambda$/2sin $\theta$, where $\lambda$ is the exposure wavelength, and 2$\lambda$ is the angle between the two intersecting laser beams. For $\lambda$=0.355 $\mu$m, $\theta$=60°, periods as low as ~0.2-$\mu$m can easily be fabricated. Typically, grating structures are first formed in photoresist followed by pattern transfer to Si using an appropriate combination of wet and dry etching techniques. Silicon reactive ion etching (RIE) techniques have been very well characterized (See e.g., P. M. Kopalidis and J. Jorne J. Electrochem. Soc., Vol. 139 (1992) which describes Si etching in $SF_6/O_2$ plasma chemistries). Wet-chemical etching of Si is also well understood (See e.g., K. E. Bean, IEEE Trans. Elect. Dev., ED-25, 1185 (1978)). Grating solar cells, or photodetectors can be made by adding a laser interference lithography step to the typical device fabrication sequence (See e.g., A. H. Fahrenbruch and R. H. Bube in *Fundamentals of Solar Cells*, Academic Press (1983)). FIG. 2 is a schematic representation of a typical top- and bottomcontact grating solar cell. Front (10) and back (50) surface contacts are formed using appropriate metal stacks taught in *Fundamentals of Solar Cells*, supra. The appropriate one-dimensional (1D) or two-dimensional (2D) grating (30) is etched on the front Si surface. Junction (20) is formed on the front surface following grating fabrication, the doping type being opposite to the wafer doping (40). For example, if the wafer is p-type, the junction will be n-type, and vice versa.

Figure 3A:
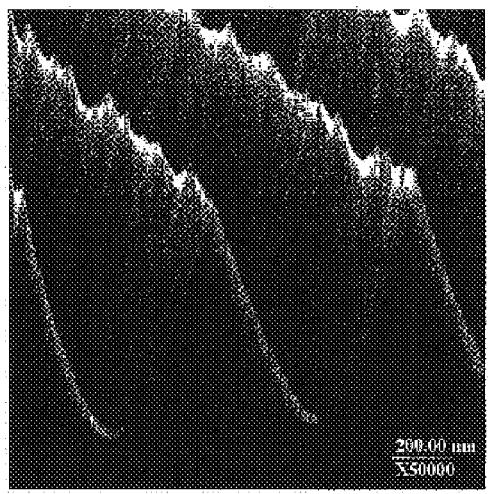
FIG. 3 shows scanning electron microscope (SEM) scans of 0.67-$\mu$m (a) and 0.42-$\mu$m (b) period, one-dimensional, triangular profile gratings etched in silicon.
Figure 3B:
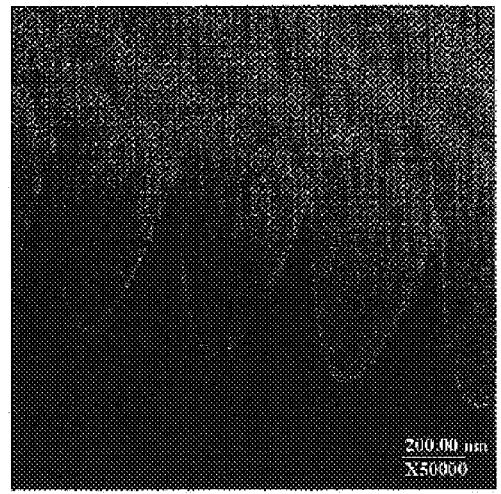

FIG. 3 shows scanning electron microscope (SEM) scans of one-dimensional, triangular profile gratings etched in Si using an $SF_6/O_2$ plasma. For the preparation of these gratings, the room temperature reactive ion etching parameters were as follows: $SF_3$=14 sccm, $O_2$=12 sccm, pressure=50 mTorr, and RF Power=50 Watt. The etch mask used was Cr (~30 nm thick) FIG. 3(a) shows the grating with period of 0.67 μm, full-width-at-half-maximum depths (FWHM) of ~0.3 μm, and depth of ~0.8 μm. FIG. 3(b) shows a grating with a period of 0.42 μm, FWHM of ~0.1 μm, and depth of ~0.5 μm.

Figure 4A:
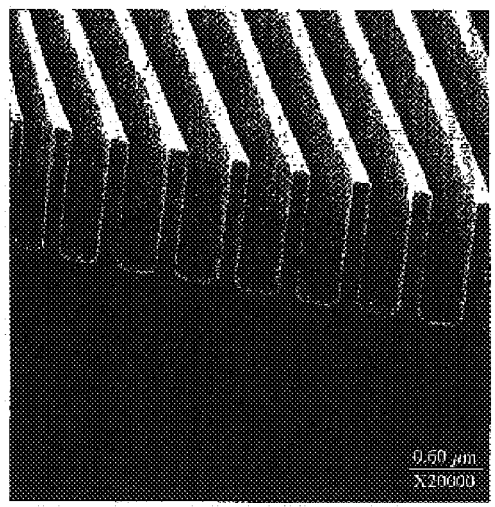
FIG. 4 shows SEM scans of 0.5-$\mu$m (a) and 0.3-$\mu$m (b) period, one-dimensional, rectangular profile gratings etched in silicon.
Figure 4B:
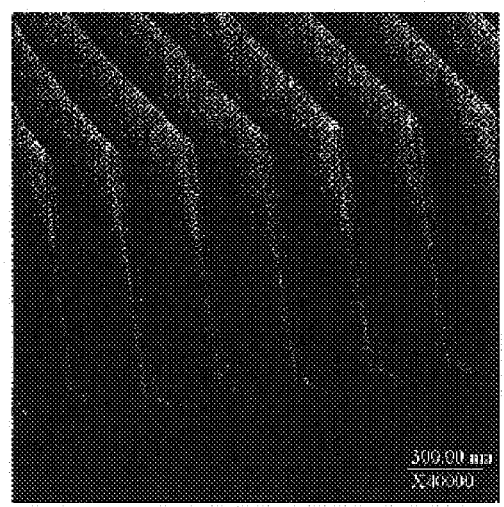

FIG. 4(a) shows a 0.5-μm period structure characterized by a linewidth of ~0.13 μm, and depth of ~1.0 μm. FIG. 4(b) shows a 0.3-μm period structure characterized by a linewidth of ~0.05 μm, and depth of ~1.0 μm. The 1D, rectangular profile gratings shown in FIG. 4 were wet-chemically etched at room temperature in (110) Si using a 40% KOH solution with an oxide mask of ~100 nm thickness.

Figure 5:
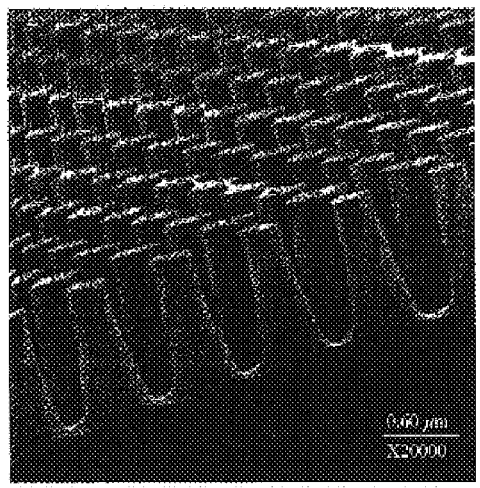
FIG. 5 shows SEM pictures of two-dimensional, 0.8-$\mu$m period post (a) and hole (b) patterns etched in silicon.
Figure 5B:
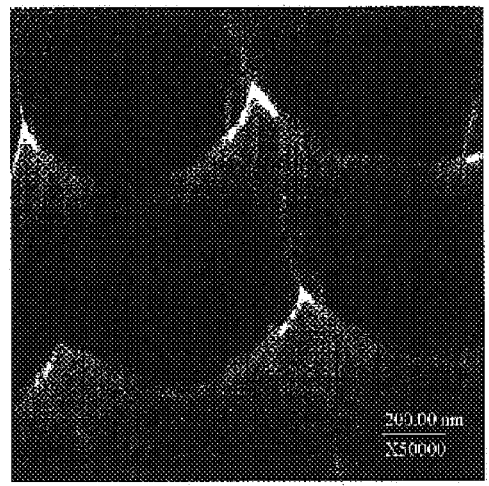

FIG. 5 shows SEM profiles for two types of 0.8 μm period, 2D RIE-etched gratings. FIG. 5(a) shows a post pattern characterized by FWHM linewidths of ~0.4 μm, and an etch depth of ~1.0 μm. FIG. 5(b) shows a hole pattern characterized by FWHM linewidths of ~0.27 μm, and an etch depth of ~0.8 μm.

2. Characterization of Subwavelength Periodic Structures in Silicon

Figure 6:
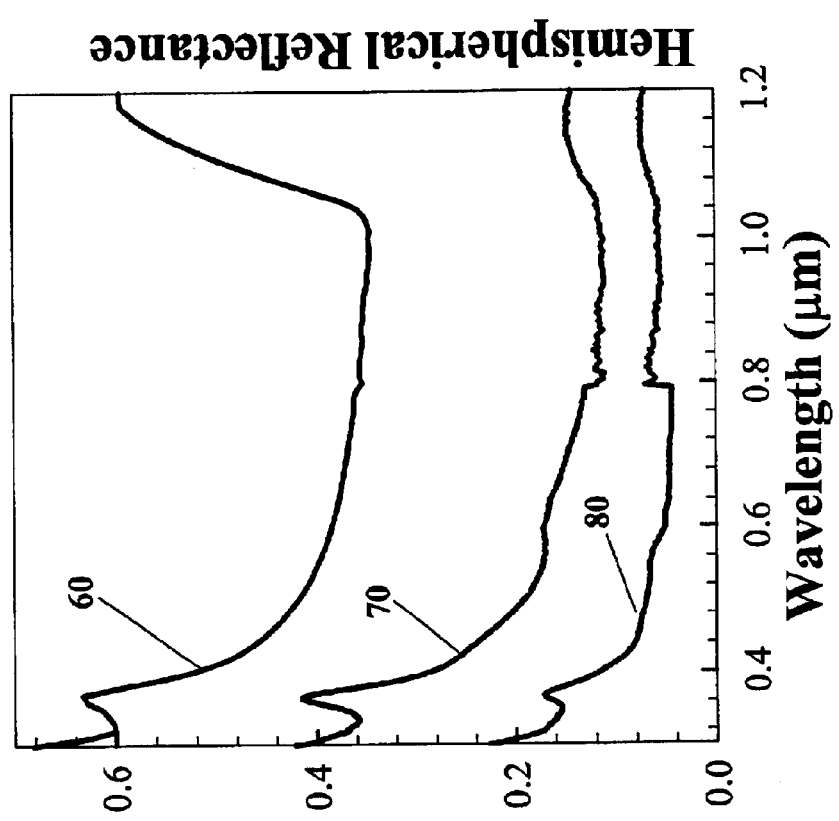
FIG. 6 shows hemispherical reflectance measurements of one-dimensional triangular profile gratings shown in FIG. 3.

FIG. 6 shows the absolute hemispherical spectral reflectance measurements from the triangular gratings shown in FIG. 3; for comparison, reflectance from polished Si is depicted by curve 60 measured under identical conditions. It is seen that the 0.67-μm period grating exhibits a broadband reduced reflection (70). Similar reflectance (80) behavior is observed by the 0.42-μm period grating structure. A comparison of the reflectance response of the two grating periods shows that significant overall lower reflection reduction is achieved as period is reduced.

Comparison of FWHM linewidths in FIGS. 3(a) and 3(b) suggests that reflection is a strong function of linewidth and its slope, with lower reflection resulting from smaller linewidths.

Figure 7:
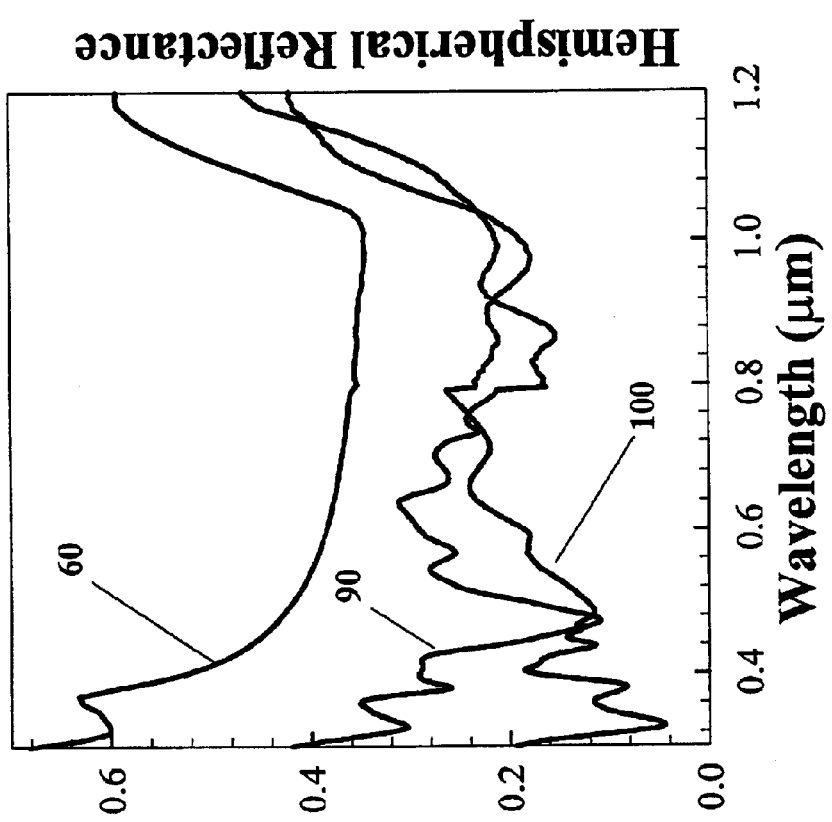
FIG. 7 shows hemispherical reflectance measurements of one-dimensional rectangular profile gratings shown in FIG. 4.

Hemispherical absolute reflectance measurements from rectangular-profiled gratings shown in FIG. 4 are plotted in FIG. 7; for comparison, reflectance from polished Si is depicted by curve 60 measured under identical conditions. For rectangular profiles, a number of narrow, low reflectance spectral bands are observed. For the 0.5-μm period structure, lowest reflection (90) is observed at λ≈0.5 μm, while the remainder of the spectral bands are not as pronounced. For the 0.3-μm period grating, lowest reflection (100) is seen at λ≈0.32 μm. For the 0.3-μm period grating, the hemispherical reflectance increases as a function of wavelength. It may be observed that in the short wavelength regime (λ<0.4 μm), reflection reduction appears to be a function of linewidth, with the smallest linewidths exhibiting the lowest reflection, which is consistent with triangular profiles.

Figure 8:
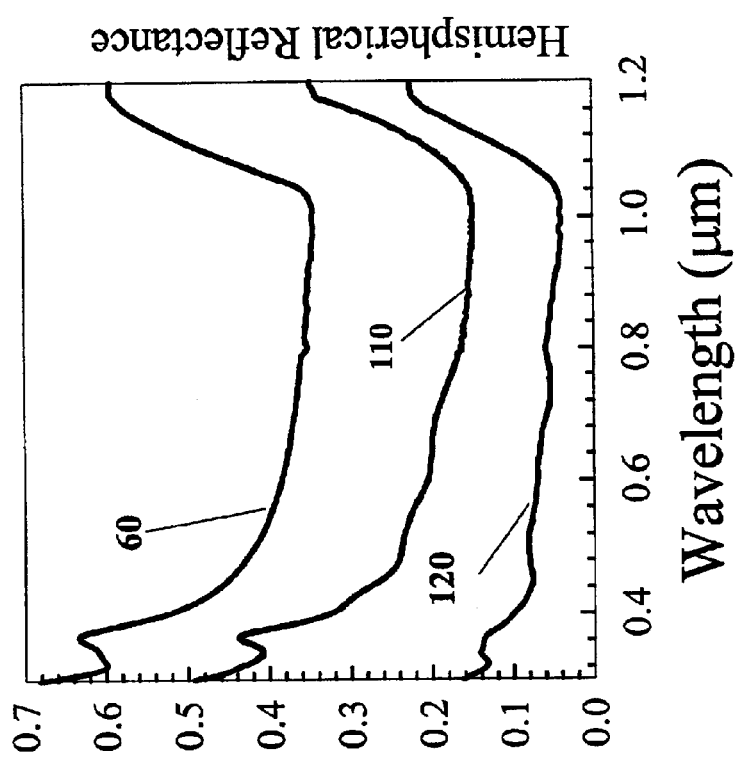
FIG. 8 shows hemispherical reflectance measurements of two-dimensional post and hole pattern gratings shown in FIG. 5.

For the 2D grating structures shown in FIG. 5, absolute reflectance measurements are plotted in FIG. 8; for comparison, reflectance from polished Si is depicted by curve 60 measured under identical conditions. FIG. 8 shows the hemispherical reflectance from the post pattern (110) is significantly higher than the hole pattern (120). Both of these structures exhibit broadband reduced reflection similar to that observed for triangular profiles in FIG. 6.

3. Polarization-Dependent Reflection Response

Figure 9:
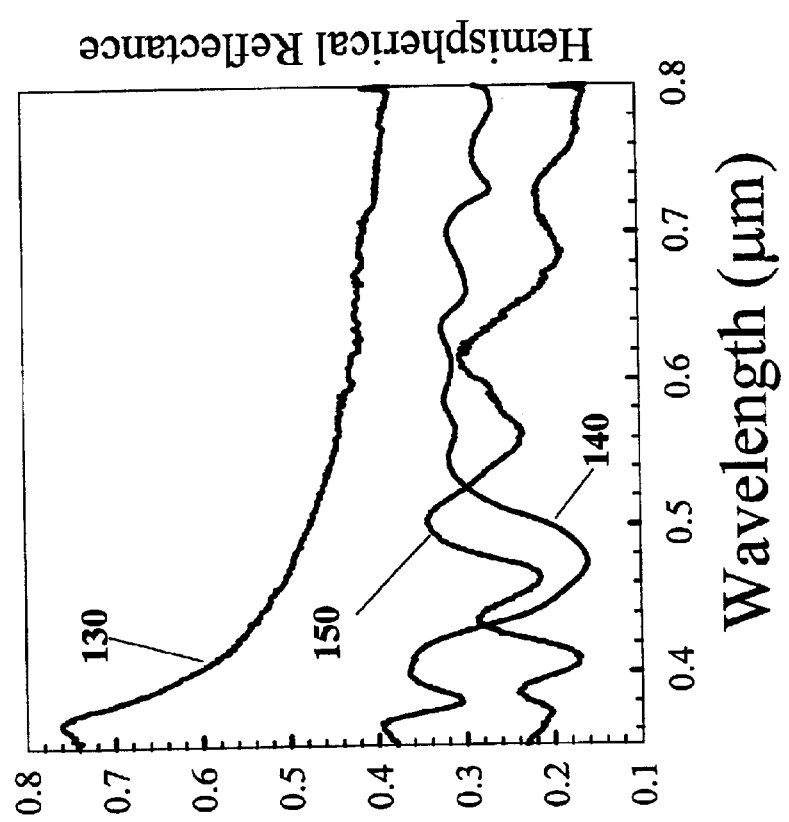
FIG. 9 shows polarization-dependent, hemispherical reflectance measurements of one-dimensional rectangular profile grating shown in FIG. 4(a).

The hemispherical reflectance measurements described in FIGS. 6–8 were conducted using randomly polarized incident light. In general, the rectangular profiles show strong polarization-dependent reflectance effects. This can be observed by the polarization-dependent hemispherical reflectance measurements for the 0.5-μm period grating shown in FIG. 4(a) as plotted in FIG. 9. Curve 130 describes the planar Si reflectance with polarized light, curve 140 plots reflectance with the electric field parallel (TE) to the grating grooves, and curve 150 plots the reflection response for electric field perpendicular (TM) to the grating lines. Therefore, in general, rectangular profiles can be designed for polarization-selective, tunable spectral reflectance response.

4. Internal Quantum Efficiency Response of Grating Solar Cells

Figure 10:
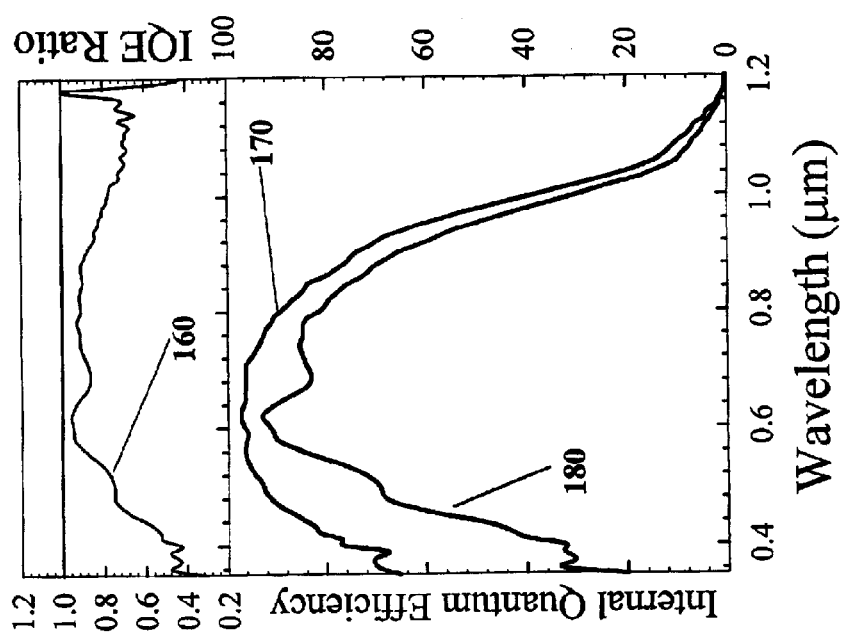
FIG. 10 shows internal quantum efficiency (IQE) measurements from one-dimensional grating solar cell, also plotted for comparison is planar surface response.
Figure 11:
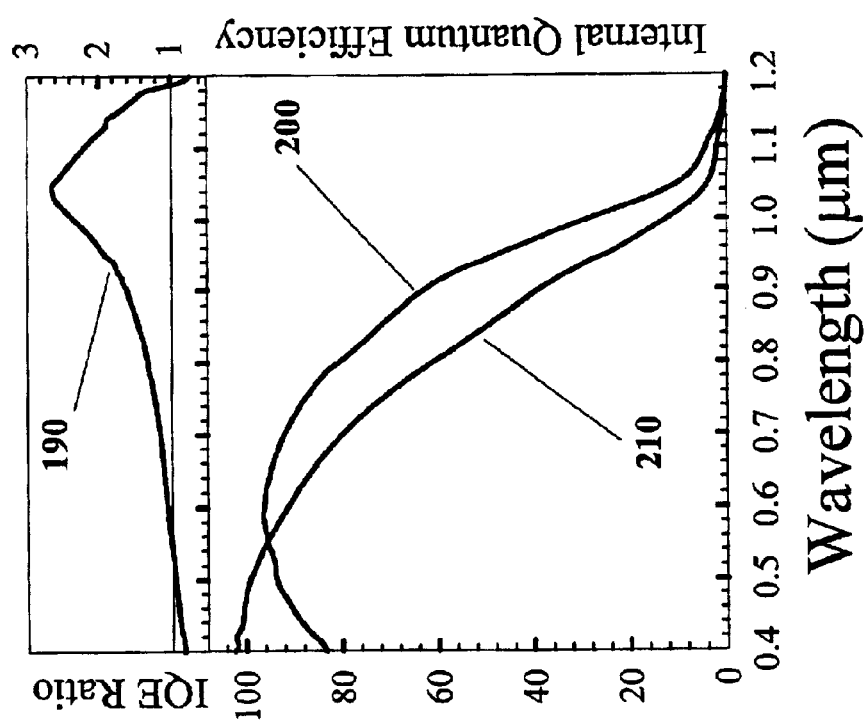
FIG. 11 shows IQE measurements from one-dimensional, rectangular profile grating solar cell, also plotted for comparison is planar surface response.
Figure 12:
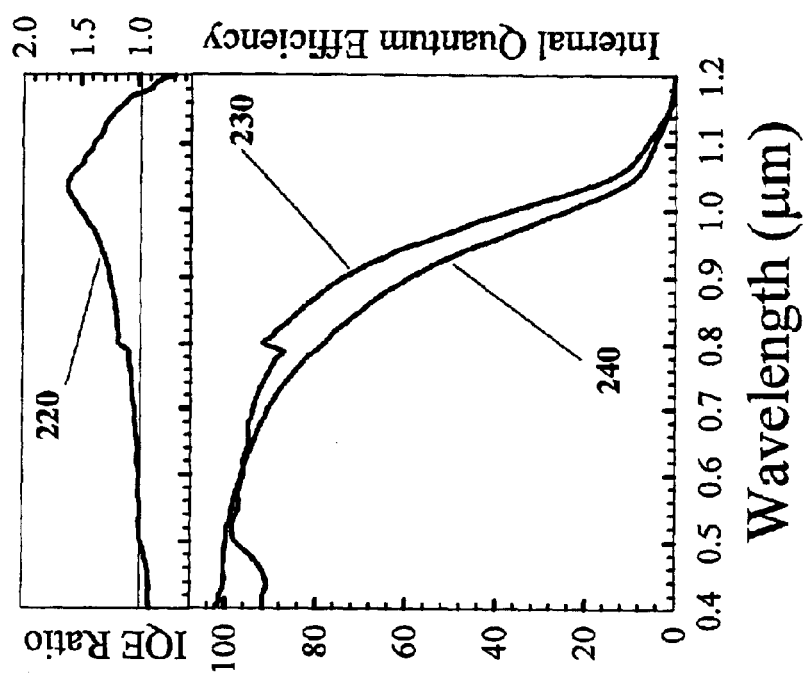
FIG. 12 shows IQE measurements from one-dimensional, triangular profile grating solar cell, also plotted for comparison is planar surface response.

Internal quantum efficiency (IQE) measurements provide detailed information about cell performance and give an accurate picture of the influence of grating structures on the performance of the solar cell. This has been well established in literature, and is also taught in the *Fundamentals of Solar Cells*, supra. FIG. 10 shows IQE measurements from the side-by-side planar and 1D grating regions of the same solar cell. This comparison assists in isolating variations in surface and bulk material properties of separate wafers. FIG. 10 plots the IQE response of grating (180) and planar (170) regions. Curve 160 is the IQE ratio of grating to the planar regions. It may be observed that in this case, the grating IQE response has been significantly reduced over the entire spectral region. This has been attributed in part to surface contamination and subsurface RIE-induced plasma damage. The process of grating fabrication introduces several contaminants including photoresist, metal, and dielectric particles. H. Mishima, T. Yasui, T. Mizuniwa, M. Abe, and T. Ohmi, IEEE Trans. Semiconductor manufacturing, 69 (1980) teach that a complete RCA clean process leads to a highly clean Si surface. FIG. 11 shows IQE response of rectangular profile 1D, 0.5-μm period grating solar cells formed by incorporation of a complete RCA clean following etching of grating structures. In FIG. 11, the line 190 plots the ratio of grating IQE (200) and planar IQE (210). It is seen that except for wavelengths <0.54 μm, grating IQE is superior to the planar region with a maximum enhancement of ~2.7 at λ~1.05 μm. The IQE response of 1D, 0.5-μm period triangular profile grating solar cells is shown in FIG. 12. In FIG. 12, the line 220 plots the ratio of grating IQE (230) and planar IQE (240). It is seen that except for wavelengths <0.52 μm, grating IQE is again superior to the planar region with a maximum enhancement of ~1.6 at λ~1.05 μm.

5. Removal of RIE Surface Damage

Figure 13A:
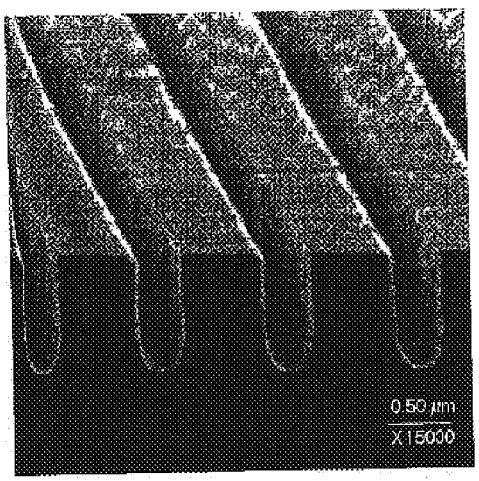
FIG. 13 shows SEM pictures of reactive ion etched (RIE), rectangular profile, one-dimensional Si grating (a), and its selective KOH etching to form an undercut profile (b).
Figure 13B:
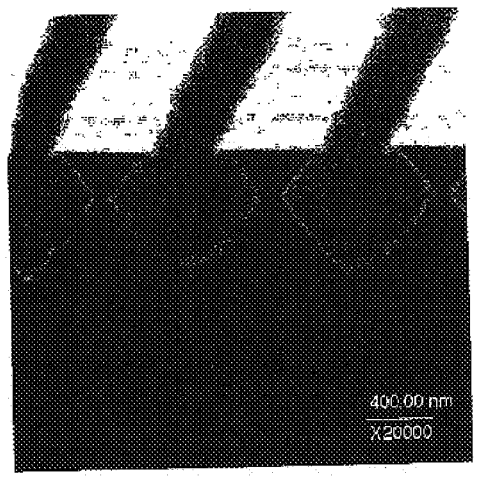
Figure 14B:
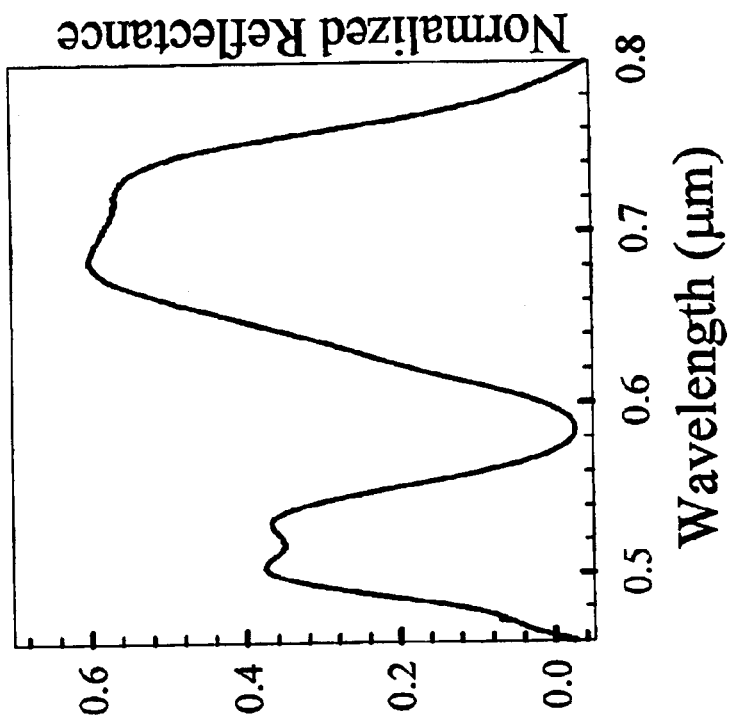
FIG. 14 shows normal incidence, normalized, polarization-dependent measurements from one-dimensional gratings shown in FIG. 13.
Figure 14A:
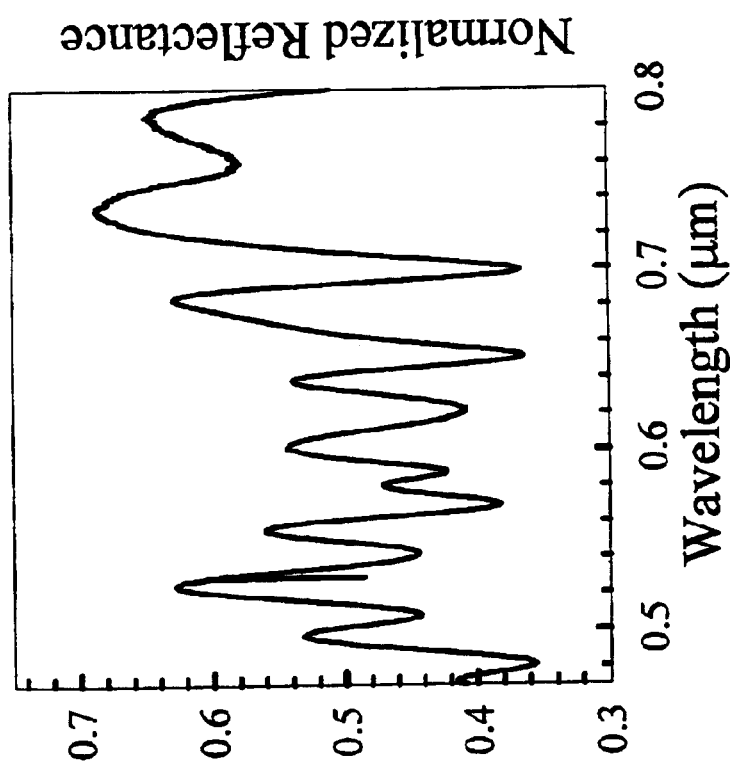

The IQE data presented in FIGS. 11 and 12 shows that some of the photo-generated carriers are being lost to RIE-induced surface damage. RIE induced surface damage has been extensively investigated. For example, S. W. Pang, D. D. Rathman, D. J. Silversmith, R. W. Mountain, and P. D. DeGraff. J. Appl. Phys. 54, 3272 (1983), have identified several techniques for removing surface damage. More recently, D. S. Ruby, Saleem H. Zaidi and M. Naraynan, in 28th IEEE PVSC Conference held in Alaska in October, 2000, describe the removal of RIE damage on randomly textured Si surfaces using a 40% KOH and nitric acid:hydrofluoric acid:water in 10:1:8 volume ratio for room temperature etch times of ~60–300 and 10–20 s, respectively. By incorporation of these damage removal etch (DRE) treatments, textured region IQEs identical to planar surfaces can be recovered. Several advantages of the KOH damage removal treatment is discussed. FIG. 13 shows SEM scans of as-RIE etched rectangular profile (a), and the profile following selective sidewall KOH etching (b). This procedure therefore leads to (a) removal of sidewall surface damage and (b) controllability over light interaction due to inverted pyramid structure. This sensitivity of the reflection response to the profile is shown in FIG. 14. FIG. 14($a$) plots the normalized TE-reflection response of 1D rectangular profile grating shown in FIG. 13($a$). FIG. 14($b$) plots the normalized TE-reflection response of 1D inverted pyramid profile grating shown in FIG. 13($b$). Comparison of reflectance responses in shown FIGS. 14($a$) and 14($b$) shows that narrowband reflectance behavior of rectangular profile is replaced by wideband resonances for the inverted pyramids. By modeling these responses, symmetric 1D and 2D structures for wavelength-selective, polarization-dependent and polarization-independent reflectance responses, respectively, can be designed.

5. Optimum Junction Formation on RIE Surfaces

Figure 15:
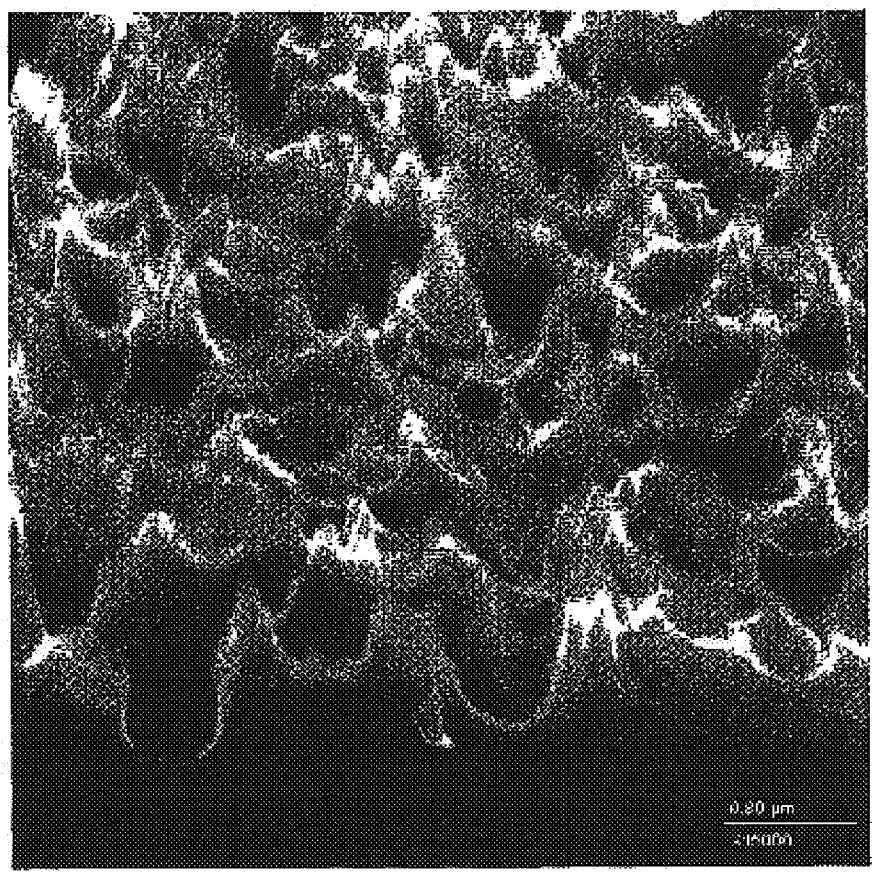
FIG. 15 shows SEM picture of a random silicon surface formed by maskless reactive ion etching.
Figure 16:
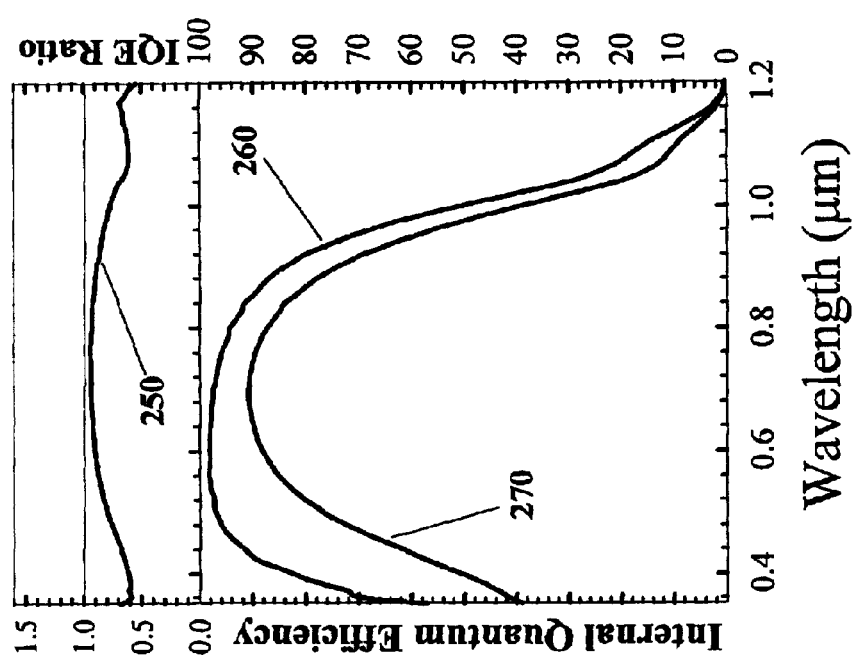
FIG. 16 shows IQE measurements from random RIE surface solar cell, also plotted for comparison is planar surface response.
Figure 17:
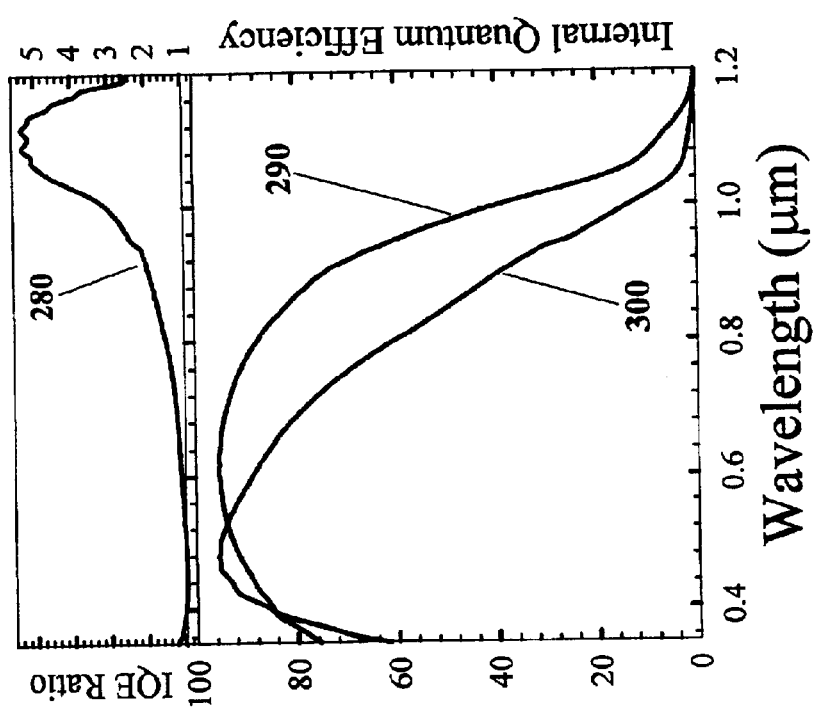
FIG. 17 shows IQE measurements from random RIE surface solar cell with ion-implanted surface junction, also plotted for comparison is planar surface response.

The RIE surface damage can be removed by wet-chemical DRE treatments discussed above. However, due to advantages in semiconductor processing, it is preferable to remove surface damage without resorting to wet-chemical etching chemistries. Ion implantation techniques for junction formation have been investigated. Ion implantation processes for junction formation have been used for solar cells (See e.g., E. C. Douglas and R. V. D'aillo, IEEE Trans. Elect. Dev. 27, 792 (1980)). During the implantation process, the surface is partially amorphized as taught in *Ion Implantation and Beam Processing*, edited by J. S. Williams and J. M. Poate, Academic Press (1984). The degree of amorphization is shown to be a function of dose level and implant energy. In order to repair the damage, annealing at high temperatures re-crystallizes the ion-implanted amorphous layers. This re-crystallization process proceeds epitaxially on the underlying crystalline substrate; for Si this solid phase re-crystallization starts at a temperature of ~525° C. During the re-crystallization process at constant temperature, the amorphous-crystalline interface moves in the direction of the surface as a function of time until the entire amorphous layer is crystallized. The possibility that during implant damage repair process, the RIE surface damage may also be repaired has been investigated by the present inventor. This experiment was done for RIE-textured, nanoscale surfaces shown in FIG. 15. It may be noticed that the random features on this surface provide significantly more open area for damage than for example a periodic surface. FIG. 16 shows IQE measurements from solar cell fabricated on such a surface using conventional gas-source diffusion for junction formation. The ratio (250) of IQE measurements from RIE textured (270) and planar (260) regions shows that due to surface damage, the textured region IQE is suppressed over the entire spectral region. FIG. 17 shows IQE measurements from solar cell fabricated on random RIE-textured surface using the ion implantation technique. The ratio (280) of IQE measurements from RIE textured (290) and planar (300) regions shows that due to amorphization repair process, both the implant and RIE damage have been removed resulting in the textured region IQE greater than the planar region over most of the spectral region. FIG. 17 also shows a maximum enhancement of ~5.4 at λ~1.1 μm, which is greater by a factor of 2 relative to the rectangular grating case shown in FIG. 11. Therefore, using an implantation technique for junction formation, superior grating solar cells can be fabricated without any surface damage. Recent developments in plasma-assisted doping techniques show that implants typical of solar cells can be provided by minor modifications of plasma chambers typically used for reactive ion etching (See e.g., M. J. Goeckner, S. B. Felch, Z. Fang, D. Lenoble, J. Galmeir, A. Grouillet, G. C. F. Yeap, d. Bang, and M. R. Lim, Jour. Vac. Sci. Technol. B17, 2290 (1999)).

6. Role of Anti-Reflection Films

Figure 18:
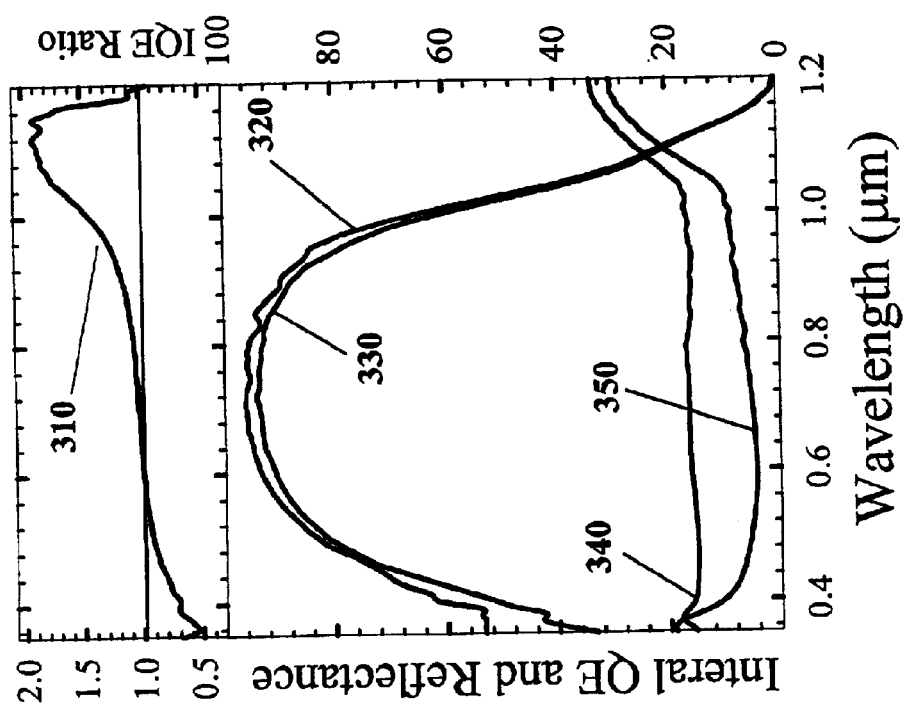
FIG. 18 shows IQE measurements from the same one-dimensional grating solar cells before and after application of anti-reflection films.

In some situations, grating structures may not act to completely reduce surface reflection. In such a situation, an optimum anti-reflection (AR) film can be applied to the surface following grating fabrication. This can be beneficial as long as the act of applying AR film does not change grating coupling efficiency into transmitted diffraction orders inside Si. This has been investigated by the IQE measurements shown in FIG. 18. The IQE ratio (310) of a 1D, 0.3-μm period grating solar cell stays approximately the same without (320) and with (330) an AR film. Applying AR film (350) significantly reduces the grating surface reflection (340).

7. Grating Solar Cells Fabrication Using Gas Source Diffusion

It is shown that the process of grating formation using reactive ion etching techniques introduces contamination and subsurface plasma-induced damage that is not completely removed even by a complete RCA clean process. Therefore, fabrication of Si solar cells and other photosensitive devices has to be modified from the teachings in *Fundamentals of Solar Cells*, supra. A typical grating solar cell fabrication procedure includes the steps of: (a) Starting with p-type Si having ~8–16 Ω-cm resistivity and thickness ~50–300 μm, grating structures are formed using RIE; (b) RCA cleaning is then used to remove surface contamination; (c) RIE-induced surface damage removal using wet-chemical etching techniques including KOH and nitric acid solutions described in section 5 hereof; (d) formation of n-type (Phosphorous doping) junction using gas source doping as taught in *Fundamentals of Solar Cells*, and (e) formation of n and p contacts using metal stacks as taught in *Fundamentals of Solar Cells*.

8. Grating Solar Cells Fabrication Using Ion Implantation

Ion implantation techniques for junction formation have been shown to be desirable in removing RIE-induced surface damage as described in section 5hereof Therefore, grating solar cells and other photosensitive can be formed using the following sequence of steps: (a) Using p-type Si having ~8–16 Ω-cm resistivity, and a thickness ~50–300 μm, grating structures are generated using RIE techniques; (b) RCA cleaning to remove surface contamination; (c) forming an n-type junction by ion implantation (typical parameters are: ion species $^3P^+$energy ~5 KeV, Dose ~2.5× 10 15 cm$^{-2}$); (d) furnace implant annealing and passivating of the oxide formed at ~1000° C. for 30 min. in an $O_2$ atmosphere; and (e) forming n and p contacts using metal stacks as taught in *Fundamentals of Solar Cells*. It should be noted that the ion implantation can also be accomplished using plasma-assisted doping techniques described in section 5.

9. Diffractive Coupling Analysis of Grating Solar Cells

Figure 19:
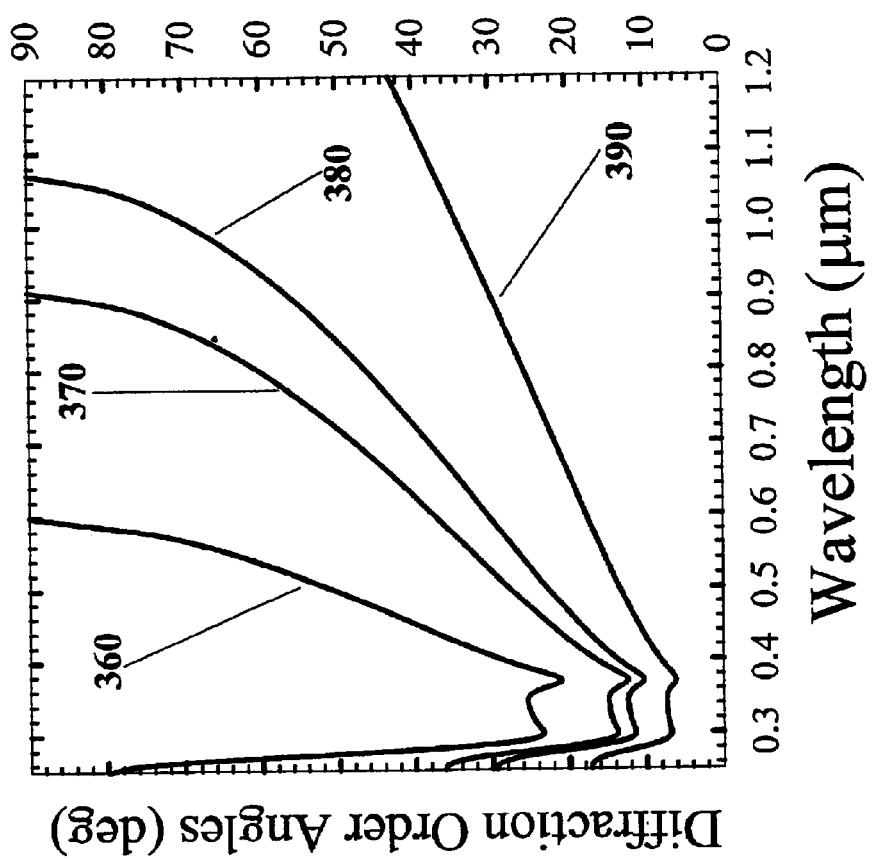
FIG. 19 shows the variation of propagation angles of the transmitted diffraction orders inside silicon, at a fixed period, as a function of wavelength.
Figure 20A:
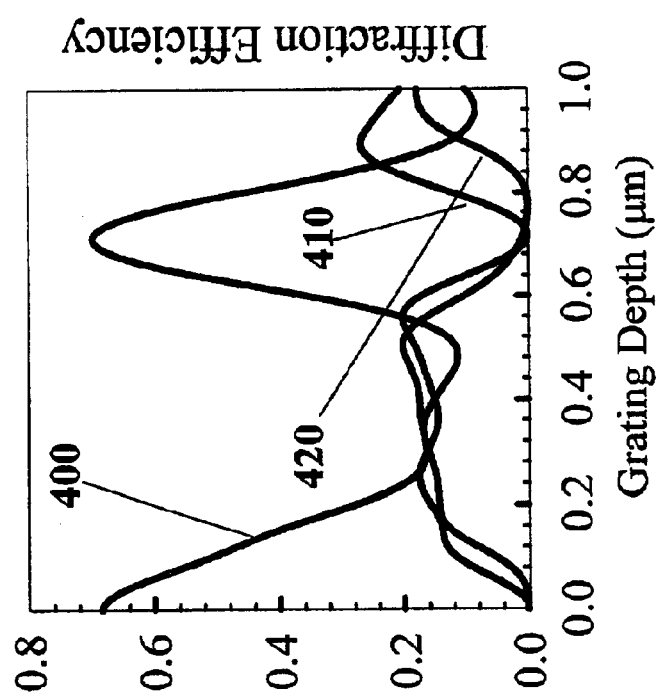
FIG. 20 shows the calculated, polarization-dependent, diffraction efficiencies for 0.65-$\mu$m period one-dimensional gratings for rectangular (a) and triangular (b) profiles.
Figure 20B:
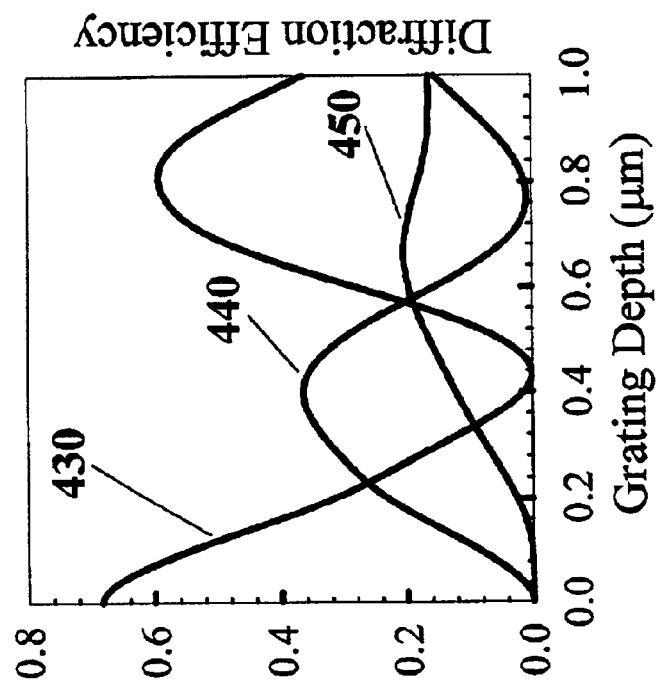

In FIG. 1 hereof, the concept of diffraction gratings for oblique coupling of light into the semiconductor was discussed. For convenience, normal incidence was assumed. Similar analysis applies for non-normal incidence. In FIG. 19, the propagation angles are plotted with respect to surface normal as a function of wavelength for the ±1 and ±2-diffraction orders inside the Si assuming normal incidence for front surface Si gratings at periods of 0.5 μm and 0.3 μm. It is observed that at a fixed period, diffraction order angles increase as a function of wavelength until it approaches ~90°, beyond which it becomes evanescent. For the 0.5-μm period grating, the first diffraction order (390) is always propagating with a maximum angle of ~42° at λ=1.2 μm, the second diffraction order (370) becomes evanescent at λ~0.9 μm. For the 0.3-μm period grating, the first diffraction order (380) becomes evanescent at λ~0.96 μm, while the second order (360) becomes evanescent at λ~0.6 μm. Therefore, enhanced absorption, particularly in the near IR region, and close to the surface can achieved by designing a grating structure which couples maximum energy into either first, or second diffraction orders propagating at large (>60°) angles. Preliminary numerical modeling using the commercially available software GSOLVER™ has been performed (See e.g., www.gsolver.com). The model calculations for triangular and rectangular profiles indicate that for propagation angles greater than 70°, the coupling into diffraction orders is reduced sharply. FIG. 20 shows two examples of such calculations for 1D, TM-polarized rectangular and triangular profile gratings. FIG. 20(a) for 0.65-μm period rectangular profile with 75% duty cycle shows that for a grating depth in ~0.2–0.4-μm range, both the ±1-diffraction (410) and ±2-diffraction (420) orders carry almost 80% of the incident energy. The energy is coupled out of the incident zero-order beam as depicted by a broad resonance in the reflection (400). FIG. 20(b) for 0.65-μm period triangular profile shows that for a grating depth of ~0.4-μm, both the ±1-diffraction (440) and ±2-diffraction (450) orders carry almost 100% of the incident energy. The energy is coupled out of the incident zero-order beam as depicted by a broad resonance in the reflection (430). For both of these cases, 1D structures were assumed. More complex calculations can be performed assuming 2D grating structures to determine optimum profiles for polarization-independent coupling into transmitted diffraction orders.

Figure 21:
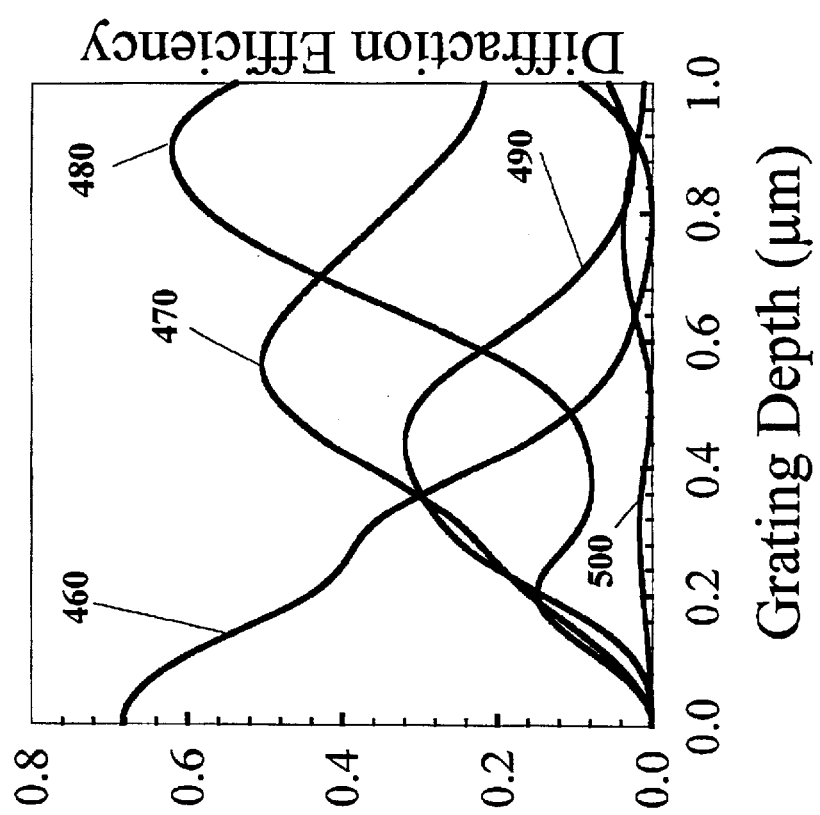
FIG. 21 shows the calculated, polarization-dependent, diffraction efficiencies for 0.65-$\mu$m period one-dimensional blazed grating.

With 1D blazed and more advanced blazed profiles as taught by S. Astilean, P. Lalanne, P. Chavel, E. Gambril, and H. Launois, Opt. Lett. 23, 552 (1998), it may be possible to couple maximum energy into diffraction orders propagating at angles in 70–90° range. We have investigated 1D blazed grating structures. FIG. 21 shows calculated, TM-polarized coupling efficiency of 0.65-μm period blazed grating a function of depth. It may be observed that at a depth of ~0.8 μm, all the incident energy is coupled out of the incident zero order (460) and re-distributed into −1-diffraction order (470), +1-diffraction order (480), +2-diffraction order (490), and +2-diffraction order (500).

The model calculations for 1D and 2D structures can be used to design Si grating parameters for maximum diffractive coupling into any desired transmitted orders. One can also design a grating filter etched in thin films deposited on top of planar, or etched Si surface. Under such conditions, the top grating structure is a passive part of the solar cell, or photodetector. The primary aim of such an approach would be to achieve wavelength-selective, polarization-independent reflectance response. In this respect, the relevant computational approach has been taught by P. Lalanne, S. Astilean, P. Chavel, E. Gambril, and H. Launois in Opt. Lett. 23, 1082 (1998). A photonic crystal approach can also be implemented for achieving wavelength-selective light response (See e.g., *Photonic Crystals* by J. D. Joannopoulos, R. D. Meade, and J. N. Winn, Princeton University Press (1995).

10. Discussion of Grating Solar Cell Results

The fabrication, reflectance and IQE characterization of subwavelength Si surfaces integrated into conventional solar cell devices has been described. By combining wafer cleaning with wet-chemical damage removal etches, and ion implanted junctions, an undamaged Si surface is recovered. Due to the diffractive coupling, significant enhancement is observed in the near IR spectral region. From an evaluation of various periodic structures, three trends can be distinguished: (a) broadband, polarization-independent, low reflective behavior of 1D triangular profiles; (b) rectangular-profiled, 1D grating structures exhibit absorption in narrow spectral bands; and (c) grating structures can combine broadband anti-reflection behavior with significant IQE enhancement in the long wavelength region. The long wavelength IQE response for 2D grating structures is expected to be superior to 1D structures.

The foregoing description of the invention has been presented for purposes of illustration and description and is not intended to be exhaustive or to limit the invention to the precise form disclosed, and obviously many modifications and variations are possible in light of the above teaching. For example, grating-texturing techniques are expected to find applications in the thin-film solar cells, space solar cells, wavelength-selective photodetectors, and polarization-dependent photodetectors. Moreover, although the present method has been described using Si as an example, it would be apparent to a skilled artisan after reviewing the present disclosure that periodic texturing techniques can be used for other material systems.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for increasing absorption of light radiation incident on a surface of a crystalline silicon photo responsive device which comprises the step of forming a grating on the surface of said photo responsive device upon which the light is incident such that a majority of the incident light entering said photo responsive device couples into diffraction orders which propagate at angles greater than 42°.

2. The method as described in claim 1, wherein said photo responsive device is selected from the group consisting of solar cells and photo detectors.

3. The method as described in claim 1 further comprising the step of forming a grating on the surface of said photo responsive device opposite to the surface upon which light is incident.

4. The method as described in claim 1, wherein said photo responsive device comprises silicon having a thickness of <100 μm.

5. The method as described in claim 1, wherein said step of forming a grating comprises reactive ion etching.

6. The method as described in claim 5, further comprising the step of selective KOH etching to remove reactive ion etching induced surface damage.

7. The method as described in claim 1, wherein said step of forming a grating comprises wet chemical etching.

8. The method as described in claim 1, wherein the grating comprises a rectangular projections.

9. The method as described in claim 1, wherein the grating comprises a triangular projections.

10. The method as described in claim 1, wherein the grating comprises a blazed grating.

11. The method as described in claim 2, wherein the grating is chosen to have optimal performance within solar cell spectrum.

12. The method as described in claim 1, further comprising the step of anti-reflection coating the surface of the grating upon which light is incident.

13. The method as described in claim 2, further comprising the step of forming a junction in the solar cell using ion implantation.

14. A method for producing a crystalline silicon solar cell having increased absorption of light radiation incident on a surface thereof which comprises the steps of: (a) forming a grating on the surface of said solar cell upon which light is incident such that a majority of the incident light entering said photo responsive device couples into diffraction orders which propagate at angles greater than 42°; (b) removing surface contamination; (c) forming an n-type junction using gas source doping; and (d) forming n- and p-electrical contacts.

15. The method as described in claim 14, wherein said step of forming a grating comprises reactive ion etching.

16. The method as described in claim 15, further comprising the step of removing reactive ion etching-induced surface damage using wet-chemical etching.

17. The method as described in claim 16, wherein said step of wet chemical etching comprises exposing the surface to KOH and nitric acid solutions.

18. The method as described in claim 14, wherein said step of forming a grating comprises wet chemical etching.

19. A method for producing a crystalline silicon solar cell having increased absorption of light radiation incident on a surface thereof which comprises the steps of: (a) forming a grating on the surface of said solar cell upon which light is incident such that a majority of the incident light entering said photo responsive device couples into diffraction orders which propagate at angles greater than 42°; (b) cleaning the surface to remove surface contamination; (c) forming an n-type junction by ion implantation; (d) annealing the solar cell formed thereby; and (e) forming n- and p-electrical contacts.

20. The method as described in claim 19, wherein said step of forming a grating comprises reactive ion etching.

21. The method as described in claim 19, wherein said step of forming an n-type junction comprises ion implantation using $^{31}P^+$.

22. The method as described in claim 19, wherein said step of annealing the solar cell comprises heating the solar cell in an oxygen atmosphere.

23. The method as described in claim 19, wherein said step of forming a grating comprises wet chemical etching.

* * * * *